United States Patent [19]
Lee

[11] Patent Number: 5,479,131
[45] Date of Patent: Dec. 26, 1995

[54] SQUID ARRAY VOLTAGE STANDARD

[75] Inventor: Gregory S. Lee, Mountain View, Calif.

[73] Assignee: Hewlett-Packard Company, Palo Alto, Calif.

[21] Appl. No.: 331,301

[22] Filed: Oct. 28, 1994

Related U.S. Application Data

[63] Continuation of Ser. No. 973,355, Nov. 9, 1992, abandoned.

[51] Int. Cl.$^6$ .................... H03K 17/92; H03K 19/195
[52] U.S. Cl. .................... 327/367; 327/368; 327/370
[58] Field of Search .................... 307/245, 277, 307/306; 333/995; 315/162; 327/186, 366, 367, 368, 369, 370, 372, 527, 528; 365/162

[56] References Cited

U.S. PATENT DOCUMENTS

| | | | |
|---|---|---|---|
| 4,117,503 | 9/1978 | Zappe | 307/306 |
| 4,151,605 | 4/1979 | Faris | 365/162 |
| 4,509,146 | 4/1985 | Wang et al. | 307/306 |
| 4,518,868 | 5/1985 | Harada et al. | 307/306 |
| 4,785,426 | 11/1988 | Harada et al. | 307/306 |
| 4,947,118 | 8/1990 | Fujimaki | 307/306 |
| 5,051,627 | 9/1991 | Schneier et al. | 307/306 |
| 5,191,236 | 3/1993 | Ruby | 307/306 |
| 5,192,951 | 3/1993 | Ko | 307/306 |
| 5,248,941 | 9/1993 | Lee et al. | 307/306 |

FOREIGN PATENT DOCUMENTS

| | | | |
|---|---|---|---|
| 150412 | 10/1990 | Japan | 307/306 |
| 404150412 | 5/1992 | Japan | 307/306 |

OTHER PUBLICATIONS

"Operation of NIST Johnson Array Voltage Standards," by Hamilton et al., *NIST J. Res.*, 95:219–235 (Apr. 1990).
"DC Voltage Multipliers: A Novel Application of Synchronization in Josephson Junction Arrays," by Semenov et al., *IEEE Trans. Magn.*, 25:1432–1435 (Mar. 1989).
"Josephson Voltage Standard Based on Single–Flux–Quantum Voltage Multipliers," by Hamilton, unpublished NIST proposal.

*Primary Examiner*—Timothy P. Callahan
*Assistant Examiner*—T. Lam

[57] ABSTRACT

A Josephson junction voltage standard based on rf controlled dc SQUID's is proposed. A microwave signal is injected using rf control lines. A D/A converter based on series-connected rf controlled SQUID's is described.

9 Claims, 4 Drawing Sheets

SQUID ARRAY VOLTAGE STANDARD

This is a continuation of application Ser. No. 07/973,355 filed on Nov. 9, 1992, now abandoned.

BACKGROUND OF THE INVENTION

The present invention relates to a voltage standard employing an array of dc SQUID's (Superconducting Quantum Interference Devices) and to a D/A converter, using the arrays of dc SQUID's.

There are several ways to build Josephson effect voltage standards. The conventional Josephson effect standard relies on millimeter-wave injection locking of a series array of Josephson junctions. (See C. A. Hamilton, C. J. Burroughs, and Kao Chieh, Operation of Josephson array voltage standards, NIST J.Res., vol.95, pp. 219–235, April 1990.) In the conventional scheme the main problem is the stabilization of the single junction against chaotic behavior which results in frequent switching between different Shapiro steps. To solve this problem the resistive leakage must be very small and the capacitance to critical current ratio $C/I_c$ must be very large, so that $f/f_p \gg 1$, where the millimeter-wave frequency f is typically 75–90 GHz, the junction plasma frequency $f_p = (eI_c/\pi hC)^{1/2}$, e is the electric charge, $I_c$ is the junction critical current, h is Planck's constant, and C is the junction capacitance. The junctions also must be rather large to achieve thermal stability, but not so large that resonant effects occur. These three factors place severe constraints even on the most reliable high quality niobium/aluminum oxide/niobium technology. Besides these limitations, frequency sources in the 75–90 Ghz range are very expensive and have a very high noise to signal ratio.

Therefore, an alternative to the conventional Josephson effect standard is desired.

Semenov et al. in DC Voltage Multipliers: a novel application of synchronization in Josephson junction arrays, IEEE Trans. Magn., vol.25, pp. 1432–1435, March 1989, and Hamilton in Josephson Voltage Standard Based on Single-Flux-Quantum Voltage Multiplies, unpublished NIST proposal, have independently proposed a "digital" approach to a Josephson effect voltage standard. The Semenov-Hamilton scheme offers the attractive possibility of using a very low frequency external source. According to this approach a sinewave at a relatively low frequency $f_s =$ 500 Mhz is converted into a train of positive single-flux-quantum (SFQ) pulses by the single-junction SQUID. The amplification of the pulse train through additional transformers is accomplished by a flux shuttle (or Josephson transmission line-JTL). This low frequency in the Hamilton proposal is multiplied 128 times by using an array of 128 junctions to dc voltage bias a single junction master oscillator operating at $128f_s$. This high frequency on-chip oscillator drives JTL's which lock larger arrays to generate 10 Volts.

This approach, however, is also impractical. First, there are a large number of junctions in the JTL which are in dc parallel so that an enormous amount of dc current is required to drive the JTL. This big current results in a high magnetic field, which can destroy the superconductive state of the Josephson junction. Secondly, the JTL's transmit a pulse-train waveform that has a high amount of harmonic content so that the fundamental I-V Shapiro step on which the array junctions are supposed to lock is severely diminished. This can lead to the junction's chaotic transitions between different Shapiro steps. In general, if a single Josephson junction is effectively biased by an rf (radio-frequency) current source, the Shapiro steps are an order of magnitude less than the "text-book" Shapiro steps, because the text-book Shapiro steps require an rf voltage source for the biasing of the single Josephson junction. The text-book situation for the Shapiro steps is never achieved either in the conventional or in the Semenov-Hamilton "new" approach for the Josephson effect voltage standard.

Thus, it is desirable to provide a practical and improved Josephson junction voltage standard.

SUMMARY OF THE INVENTION

The present invention is unique because it enables the practical realization of a voltage standard employing an array of rf controlled SQUID's.

One aspect of the present invention is directed to a circuit for supplying a voltage standard. The voltage standard comprises at least one array of rf controlled SQUID's connected in series. Each SQUID is dc biased and includes two Josephson junctions forming a superconducting loop with an inductor. A magnetic coupling couples an rf control line magnetically to each SQUID.

In one embodiment the magnetic coupling means includes a main rf line and a number of rf control lines connected in parallel to the main rf line. The optimum number of parallel rf driven control lines ranges from 1 to 10.

In another preferred embodiment the magnetic coupling means includes two control lines being 180° out of phase with each other so that the magnetic flux coupled with each SQUID is twice that provided by a single control line.

The d.c. offset in the control flux is preferably 0 mod $\Phi_0$ if the selected number n of flux quantum transitions per junction per cycle (or the SQUID's quantum number) is even, and preferably $\Phi_0/2$ mod $\Phi_0$ if the selected quantum number n is odd.

Another aspect of the present invention is directed to a D/A converter converting a digital word having m bits, m being a positive integer, to an analog voltage. The D/A converter comprises a plurality of SQUID's each comprising two Josephson junctions connected in parallel. The Josephson junctions form a superconducting loop with an inductor. Each Josephson junction is connected in parallel with a damping resistor and magnetically coupled to an rf control signal. A set of m current sources represents a digit, wherein a positive current from the k–th source, k ranging from 0 to (m−1), indicates a "1" value for the k–th digit, and a negative current from the k–th source indicates a "0" value for the k–th digit. The SQUID's are connected in sequence to form m stages, from the 0–th stage to the (m−1)–th stage. The k–th stage comprises $2^k$ said SQUID's connected in series, k ranging from 0 to (m−1) and the k–th stage is series-connected with the k–th current source. A voltage across the m stages is an output analog signal V, whose magnitude ranges from $(-)(2^m-1)nhf/2e$ to $(2^m-1)nhf/2e$, where n is the number of flux quantum transitions per junction per cycle or the SQUID's quantum number.

BRIEF DESCRIPTION OF THE DRAWINGS

Identical components in the figures are labeled by the same numerals.

DETAILED DESCRIPTION OF THE PREFERRED EMBODIMENT

It is well known that an applied d.c. voltage causes an a.c. current to flow through a Josephson junction. Therefore, the Josephson junction placed under d.c. external voltage behaves as an oscillator. If an external pure sinusoidal oscillation is applied to the Josephson junction, it can cause the junction-oscillator to be synchronized to the basic oscillation and to the harmonics of the external source. In a Josephson junction such synchronized states are recognizable as steps in the direct current characteristic, called Shapiro steps.

The assumption that the a.c. voltage across the Josephson junction is purely sinusoidal is correct for large capacitance C. This is the case for the Josephson tunnel junctions with superconductor-insulator-superconductor (SIS) structure, where all the harmonics are short-circuited and the size of the internal resistance of the rf generator has no effect on the shape of the direct current characteristic.

In the other limiting case of the junction with junction capacitance C=0 hysteresis disappears in the direct current characteristic. In such a junction, the Shapiro steps of constant voltage are displaced so far from each other in the direction of the current that they no longer overlap.

In the most realistic intermediate case of the junction with a non-zero capacitance C, in certain regions of values of the applied rf power and its frequency the direct current curves of Josephson junctions reveal some irregular zones, such as, for example, intermittent steps and regions of negative differential resistance. This leads to chaotic behavior of the junction.

Therefore, the main problem in building circuits utilizing the Shapiro steps of the Josephson junctions is to avoid the chaotic behavior connected with transitions between different Shapiro steps.

One of the traditional ways to get rid of the chaos in a Josephson junction is to apply a microwave signal with an rf frequency f of the injected microwave signal $f/f_p \gg 1$, where $f_p$ is the plasma frequency of the Josephson junction. Therefore the "conventional" Josephson effect voltage standard relies on high-frequency millimeter-wave injection locking of a series array of high-quality extremely hysteretic Josephson junctions to prevent the chaotic behavior.

The proposed invention offers the opportunity to build an economical, easy to fabricate Josephson junction voltage standard using an array of rf controlled SQUID's with rf frequency $f \ll f_p$.

It is proposed to implement a voltage standard with a series array of rf controlled dc SQUID's. The current in the series connected SQUID's is lower than in parallel connected junctions used in Hamilton's shuttle, therefore the problem of high magnetic field associated with the high dc current which can destroy the SQUID's superconductive state is avoided.

Figure 1:
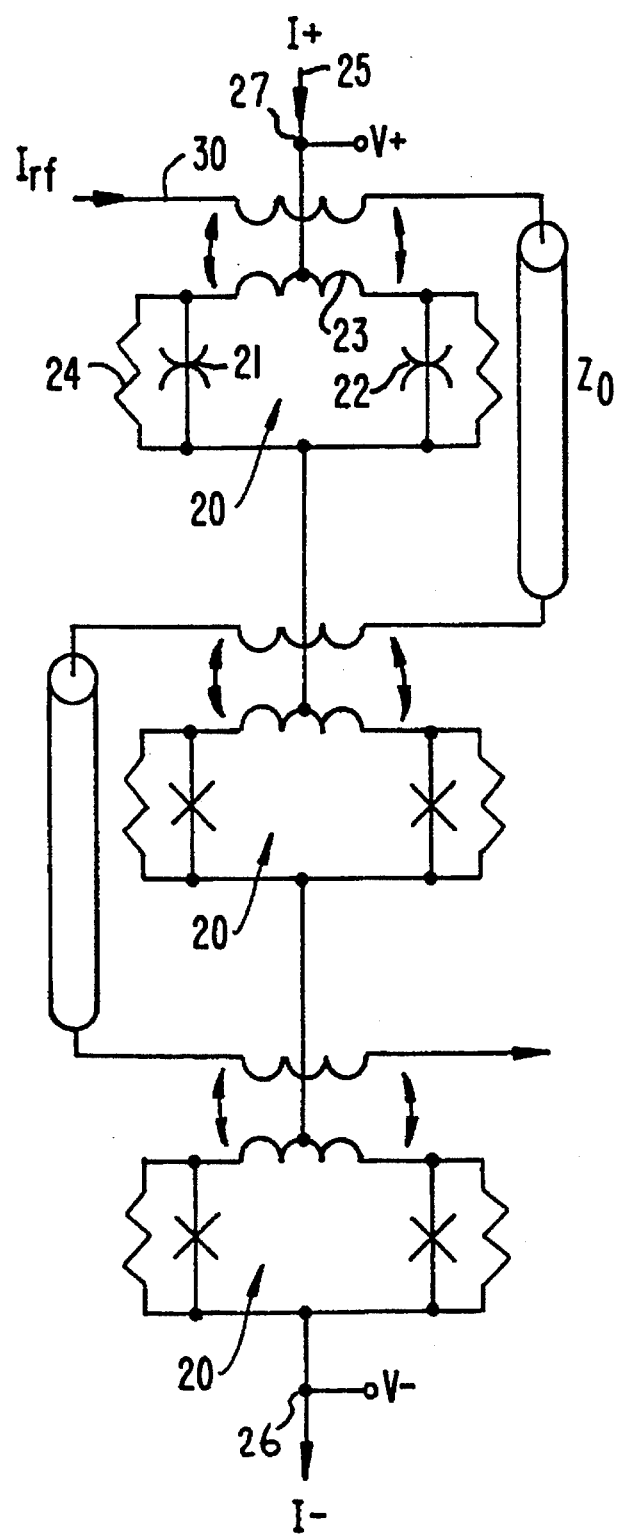
FIG. 1 is a schematic circuit diagram of an rf controlled SQUID voltage standard to illustrate an embodiment of this invention.

In reference to FIG. 1, each rf controlled SQUID includes two Josephson junctions 21 and 22, connected in parallel and forming a superconducting loop with inductor 23. The damping resistors 24 each connected in parallel with each Josephson junction serve to stabilize the SQUID in the superconductive state and to insure against the chaotic transition into the voltage state. As shown in FIG. 1, a SQUID array 20 comprises SQUID's connected together in series between two nodes 27 and 26. The SQUID array 20, shown in FIG. 1 for the 3 SQUID's, has a dc current bias 25 and each SQUID is magnetically coupled to one or more rf control lines 30 carrying the externally generated microwave frequency. Optionally, an additional dc offset control magnetic flux may be applied either through the same control line(s), another on-chip control line, or simply by an off-chip solenoid.

Due to the presence of resistive shunting in the present invention the I-V curve is single-valued. Therefore one should be able to find the Shapiro step with the most magnitude, because for appropriate rf amplitude and dc offset and for a fairly uniform set of SQUID's and rf distribution, one voltage step will be much larger than all others. In contrast, in the conventional voltage standard the I-V characteristic is extremely multi-valued and there are thousands of nearly equally strong voltage steps at the zero operating current. This means that it is necessary to perform a "hunt" for the correct step. The Semenov-Hamilton approach also provides a single-valued I-V curve; however, the voltage steps are much smaller and are believed to have operating margins too small for a large array to successfully work.

Figure 2A:
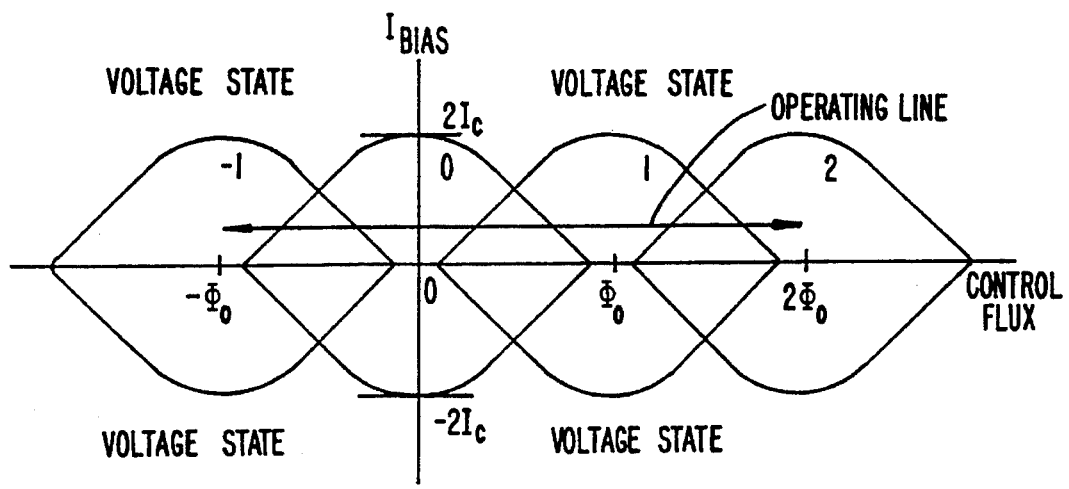
FIG. 2A is a SQUID threshold lobe picture for the odd quantum numbers of the circuit of FIG. 1.
Figure 2B:
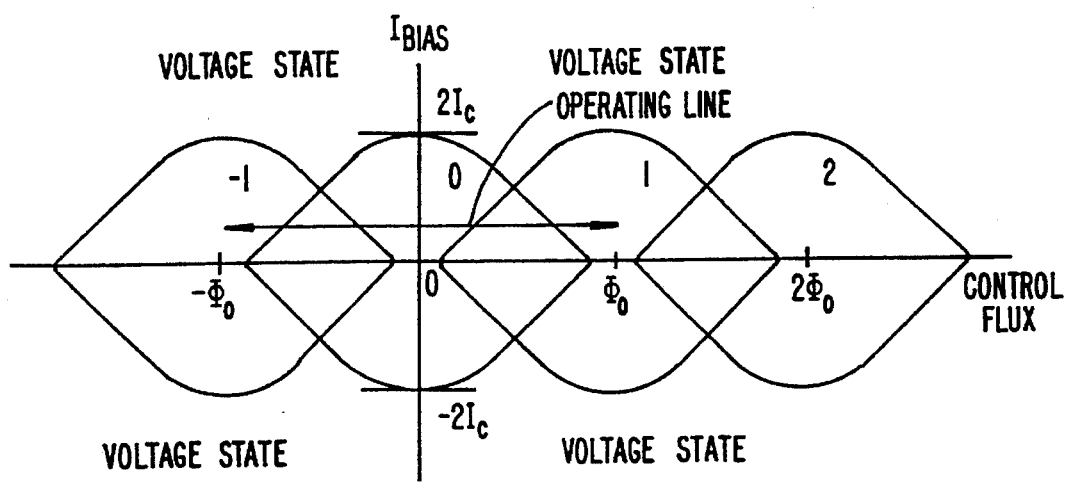
FIG. 2B is a SQUID threshold lobe picture for the even quantum numbers of the circuit of FIG. 1.

In the present invention the control flux acts as a clock which elicits a single flux quantum (SFQ) pulse from one of the SQUID junctions 21 each time a flux quantum is passed in the positive direction and elicits a balancing SFQ pulse from the other SQUID junction 22 each time a flux quantum is passed in the negative direction. The output voltage across the array is $V_{out}=Nnhf/2e$ where N is the number of SQUID's in series, n is the quantum number (number of flux quantum transitions per junction per cycle), h is Planck's constant, f is the rf control frequency, and e is the electronic charge. FIGS. 2A, 2B show the operating conditions in the SQUID's periodic $I_{bias}$–$\Phi_{control}$ (bias current-control flux) diagram. For a given quantum number n the optimum peak-to-peak rf control flux is $n\Phi_0$ and the optimum dc offset flux is 0 for even n and $\Phi_0/2$ for odd n. Here $\Phi_0$ is the flux quantum $h/2e=2.068\times 10^{-15}$ Wb.

The dc bias current $I_{bias}$ is relatively easy to provide, using for instance "four-point" probing, so that the output voltage of the array does not include resistive voltage drops across the bias contacts.

Figure 3A:
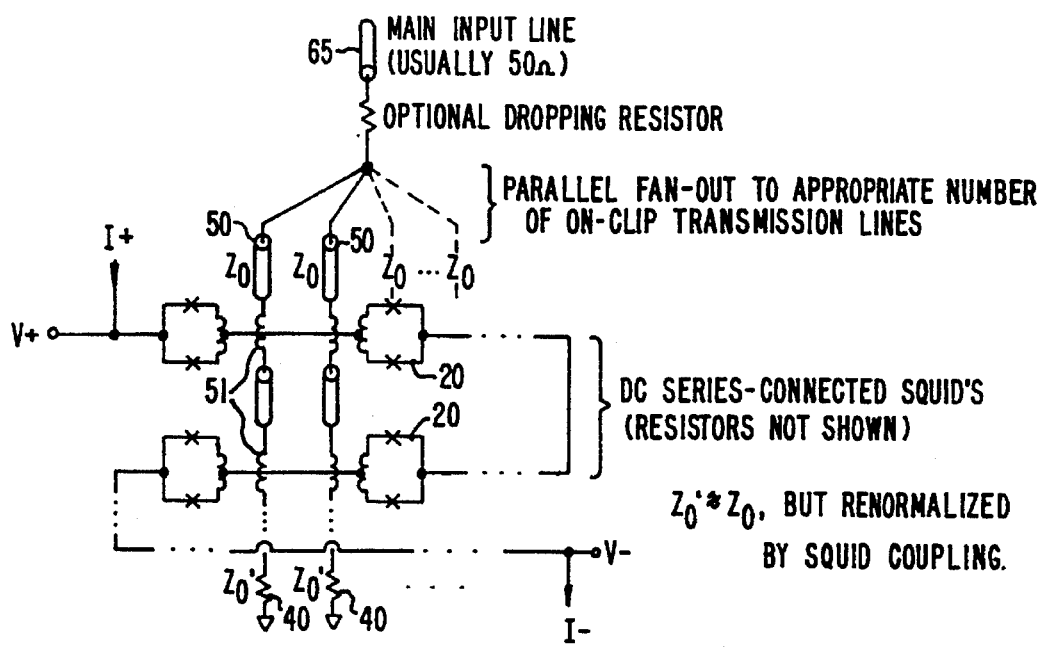
FIG. 3A illustrates the one-line per SQUID magnetic coupling means including a main input rf line and the optimum number of rf control lines coupled to the rf controlled SQUID's of FIG. 1.
Figure 3B:
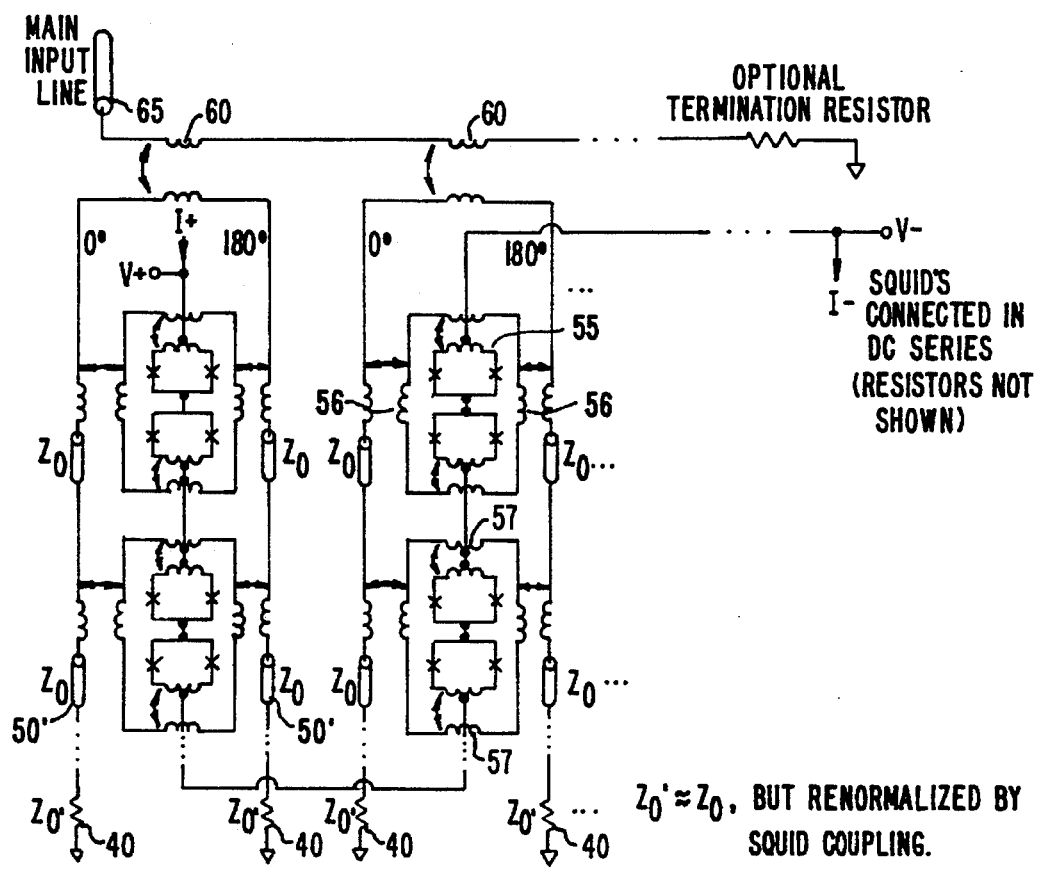
FIG. 3B illustrates the two-lines-per-SQUID magnetic coupling means including two control lines being 180° out of phase with each other coupled to the intermediate coupling means which are coupled to the rf controlled SQUID's of FIG. 1.

In one embodiment one or more transmission lines 30 with matched terminations 40 are used to distribute the rf control frequency from the main input line 65 to the SQUID's 20, as shown in FIG. 3A. Each transmission line includes inductors 51, which provide magnetic coupling between the transmission lines and the SQUID's 20, as shown in FIG. 3A. The minimum number of lines driven in rf parallel is determined by the extinction length of the rf current to insure that the SQUID's at the beginning and end of each line are excited to the same quantum transition number n. The optimum number of parallel rf driven control lines is within the range of 1 to 10. In another embodiment shown in FIG. 3B two transmission lines 30 driven 180° out of phase to each SQUID. This reduces the rf current by about a factor of two. The 180° phasing can be simply accomplished by a transformer launch 60 magnetically coupled to the main input rf line 65. The main input rf line is coupled to the on-chip transmission lines 30 which are coupled through transformers 56 to the intermediate loop 55 which is finally magnetically coupled through transformers 57 to one or more SQUID's. The present scheme can be viewed as a more "digital" approach to a voltage standard because it is based on digital SQUID SFQ ideas. In contrast to the conventional Josephson voltage standard, this scheme works for frequencies f<$f_p$. In practice, it is convenient to choose the operating frequency f in the X-band or K-band (18–26.5 Ghz) regions. Frequency-stable X-band oscillators are very economical and they can be cheaply frequency doubled to produce an adequate K-band source. Alternatively, direct K-band sources stabilized by dielectric resonators are also readily available. It should be briefly noted that for the sake of simplicity in FIGS. 3A and 3B the damping resistors 24 are not shown.

In addition to allowing the use of more economical frequency sources, the voltage standard proposed here allows completely conventional fabrication methods which have been greatly refined for niobium-based digital superconducting electronics. That is, higher current density junctions can be used. Because of this, the junctions and even the SQUID's can be quite small in area and still have enormous stability against thermal fluctuations. Thus, a very large number (N≈100000) of SQUID's can be fit on a square centimeter substrate.

The scheme proposed here does not rely on high-quality, hysteretic junctions. Thus, this technique can work with weak-link junctions such as those presently available for high temperature superconductors. It is possible, therefore, to contemplate a higher temperature, liquid nitrogen temperature, voltage standard which would be much cheaper than the present standards.

Figure 4:
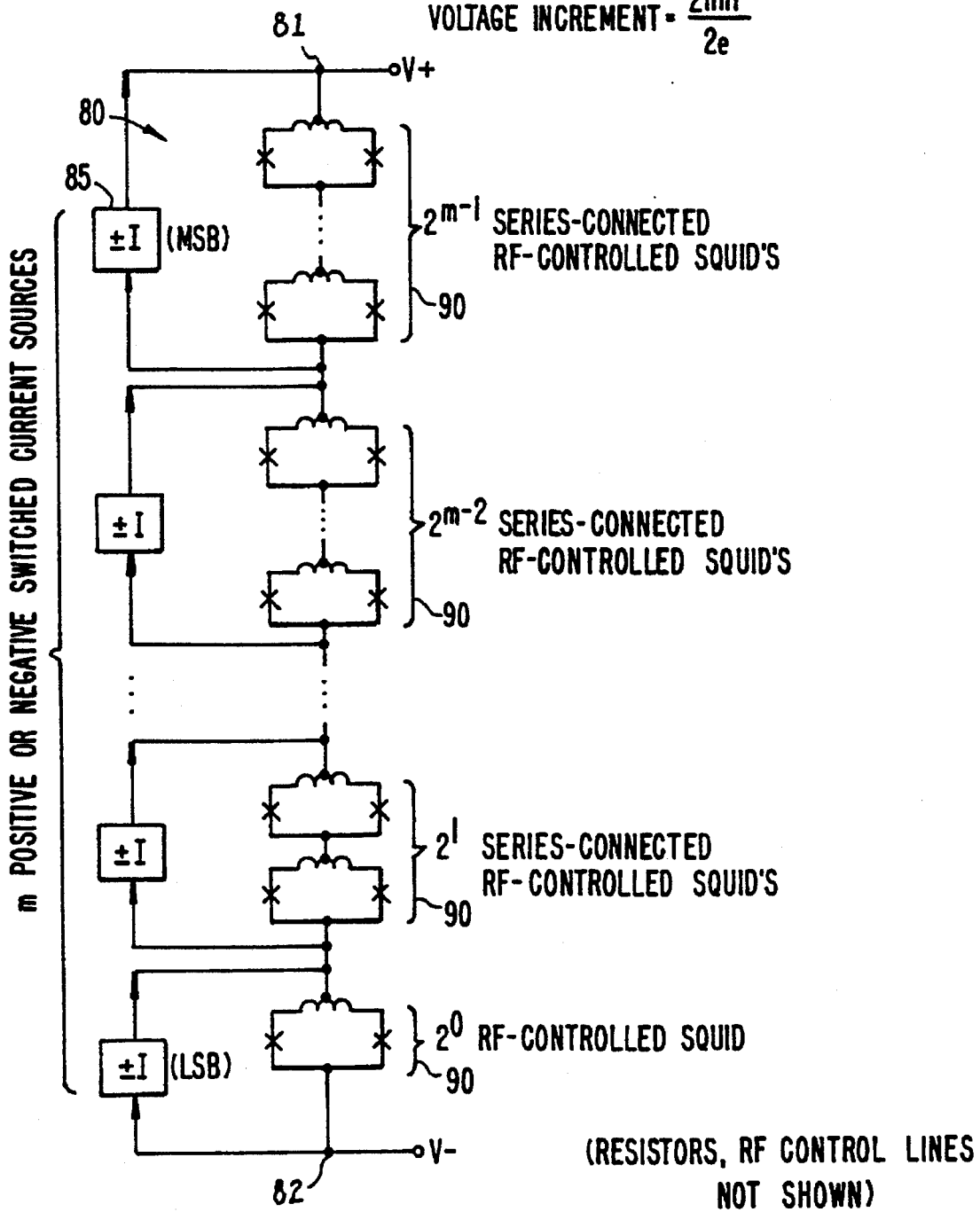
FIG. 4 illustrates a digital-to-analog converter which converts digital currents to an analog voltage employing series connected rf controlled SQUID's of FIG. 1.

The proposed scheme can be also used for a high precision, high speed the digital-to-analog converter (D/A) 80 which converts digital currents to m-bit analog voltage, as is shown in FIG. 4. A set of m current sources 85 represents a set of m digits, where a positive current from the k-th source indicates a "1" value for the k-th digit, and a negative current from the k-th source indicates a "0" value for the k-th digit, k ranging from 0 to (m−1). These current sources function as dc biasing means for the SQUID's which are series-connected and rf controlled (not shown). Hence, each current source is connected with $2^k$ rf controlled SQUID's comprising a k-th stage 90, k ranging from 0 to (m−1). The magnitude V of the output voltage across the m stages between two nodes (81) and (82) ranges from (−)($2^m$−1)*n*h*f/2e to ($2^m$−1)*n*h*f/2e. The single valued I-V curve guarantees that the output voltage is uniquely determined even as any of the m bits are switched. It should be noted that for the sake of simplicity the damping resistors 24 and the rf control line 30 are not shown.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:
1. A circuit for supplying a voltage standard comprising:
at least one array of at least two SQUID's connected in series between two nodes;
each of said SQUID's including two Josephson junctions connected in parallel, an inductor and damping resistors, said Josephson junctions and said inductor connected in a superconducting loop, said two damping resistors each connected in parallel with each said Josephson junction thereby shunting each said Josephson junction;
means for applying dc bias current between the two nodes to the array so that a dc bias current flows constantly through each of the SQUID's in the array and so that the same current flows simultaneously through each of the SQUID's in the array;
means for magnetically coupling an rf control signal having a frequency to each of said SQUID's, in order to apply a control flux to each of the at least two SQUID's, thereby causing an output voltage across the two nodes, said output voltage serving as the voltage standard, wherein said magnetic coupling means includes:
two control lines; and
intermediate magnetic coupling means including a plurality of loops, each loop comprising at least two pairs of inductors, one pair magnetically coupling the loop to the two control lines and the other pair magnetically coupling the loop to some of the sequentially connected SQUID's in the array;
said two control lines being 180° out of phase with each other so that the magnetic flux coupled with each said SQUID is twice that provided by a single control line.
2. A method for supplying a voltage standard comprising:
providing one or more SQUID's connected between two nodes, each of said SQUID's including two Josephson junctions connected in parallel, an inductor and damping resistors, said Josephson junctions and said inductor connected in a superconducting loop, said two damping resistors each connected in parallel with each said Josephson junction thereby shunting each said Josephson junction;
applying a dc bias current between the two nodes; and
magnetically coupling an rf control signal having a frequency to each of said SQUID's, in order to apply a control flux to each of the SQUID's, the amplitude of said rf control signal being selected such that the rf control signal causes a predetermined integer number n flux quantum transitions per junction per cycle of each of the SQUID's, thereby causing an output voltage across the two nodes, said output voltage serving as a voltage standard and standard said voltage being proportional to the frequency of the rf control signal f and to n;
wherein said coupling step applies to each of the SQUID's a dc offset flux so that when n is even, then the d.c. offset in the control flux is 0 modulo $\Phi_0$, and when n is odd, the d.c. offset in the control flux is $\Phi_0/2$ modulo $\Phi_0$, $\Phi_0$ being the flux quantum h/2e, where h is the Planck's constant and e the charge of an electron.
3. The method of claim 2, wherein said applying step applies dc bias current to the array so that a dc bias current flows constantly between the two nodes and through each of the SQUID's.
4. The method of claim 2, said providing step providing a plurality of SQUID's connected in series between the two nodes, wherein the output voltage is proportional to the number of SQUID's between the two nodes.

5. A circuit for supplying a voltage standard comprising:

one or more SQUID's connected between two nodes, each of said SQUID's including two Josephson junctions connected in parallel, an inductor and damping resistors, said Josephson junctions and said inductor connected in a superconducting loop, said two damping resistors each connected in parallel with each said Josephson junction thereby shunting each said Josephson junction;

means for applying a dc bias current between the two nodes; and means for magnetically coupling an rf control signal having a frequency to each of said SQUID's, in order to apply a control flux to each of the SQUID's, the amplitude of said rf control signal being selected such that the rf control signal causes a predetermined integer number n flux quantum transitions per junction per cycle of each of the SQUID's, thereby causing an output voltage across the two nodes, said output voltage serving as a voltage standard and said standard voltage being proportional to the frequency of the rf control signal f and to n;

wherein said coupling means applies to each of the SQUID's a dc offset flux so that when n is even, then the d.c. offset in the control flux is 0 modulo $\Phi_0$, and when n is odd, the d.c. offset in the control flux is $\Phi_0/2$ modulo $\Phi_0$, $\Phi_0$ being the flux quantum h/2e, where h is the Planck's constant and e the charge of an electron.

6. The circuit of claim 5, said circuit comprising a plurality of said arrays of said SQUID's, wherein said magnetic coupling means includes a main rf line and one or more rf control lines connected in parallel to said main rf line, said control lines including inductors, said inductors being each magnetically coupled with one of said SQUID's.

7. The circuit of claim 6, where the optimum number of parallel rf driven control lines is within the range of 1 to 10.

8. The apparatus of claim 5, wherein said applying means applies dc bias current to the array so that a dc bias current flows constantly between the two nodes and through each of the SQUID's.

9. The apparatus of claim 4, said apparatus comprising a plurality of SQUID's connected in series between the two nodes, wherein the output voltage is proportional to the number of SQUID's between the two nodes.

* * * * *